US006718502B1

(12) United States Patent
Kuznetsov et al.

(10) Patent No.: US 6,718,502 B1
(45) Date of Patent: Apr. 6, 2004

(54) PRECODERS FOR PARTIAL RESPONSE CHANNELS

(75) Inventors: Alexander Kuznetsov, Singapore (SG); Qing-Wei Jia, Singapore (SG)

(73) Assignee: Data Storage Institute (SG)

( * ) Notice: Subject to any disclaimer, the term of this patent is extended or adjusted under 35 U.S.C. 154(b) by 562 days.

(21) Appl. No.: 09/637,233

(22) Filed: Aug. 11, 2000

(51) Int. Cl.[7] .................. H03M 13/00; H03M 13/03; H03M 3/00; H04L 23/02
(52) U.S. Cl. .................. 714/755; 714/786; 375/263; 341/143
(58) Field of Search .................. 714/755, 758, 714/792, 795; 769/53.35, 53.21; 375/244; 341/76, 94, 143

(56) References Cited

U.S. PATENT DOCUMENTS

| | | | |
|---|---|---|---|
| 5,497,384 A | | 3/1996 | Fredrickson et al. .......... 371/43 |
| 5,537,424 A | * | 7/1996 | Karabed et al. ............. 714/795 |
| 5,809,080 A | * | 9/1998 | Karabed et al. ............. 375/263 |
| 5,809,081 A | | 9/1998 | Karabed et al. ............. 345/263 |
| 5,881,071 A | | 3/1999 | Kuznetsov et al. ....... 371/37.01 |
| 6,029,264 A | * | 2/2000 | Kobayashi et al. ......... 714/755 |
| 6,084,535 A | * | 7/2000 | Karabed et al. .............. 341/58 |
| 6,112,326 A | * | 8/2000 | Khayrallah ................. 714/790 |
| 6,408,419 B1 | * | 6/2002 | Karabed et al. ............. 714/792 |

OTHER PUBLICATIONS

"Turbo Decoding for Partial Response Channels" Souvignier et al. in IEEE Transactions on Communications, On page(s): 1297 1308 vol.: 48, Issue: 8, Aug. 2000.*

"Vector Coding for Partial Response Channels" Kasturia et al. in: IEEE Transactions on Information Theory, On page(s): 741–762 vol.: 36, Issue: 4, Jul. 1990.*

"Vector Coding for Partial Response Channels" Aslanis et al. This paper appears in: Military Communications Conference, 198 MILCOM 88, Conference record. '21st Century Miltiary Communications—What's Possible?'. On page(s): 667–671 vol. 2 Oct. 23–26, 1988.*

"Vector Coding with Decision Feedback Equalization for Partial Reponse Channels" Kasturia et al. in: Global Telecommunications Conference, 1988, and Exhibition. 'Communications for the Information Age.' Conference Record, GLOBECOM '88., IEEE 28 Nov. –1 D.*

IEEE Transactions on Communications; *"Structured Set partitions and Multilevel Concatenated Coding for Partial Response Channels"*; vol. COM–47, No. 6; Jun. 1999; pp. 856–861.

IEEE Transaction on Information Theory, *"Constrained Coding for Binary Channels with High Intersymbol Interference"*; vol. IT–45, No. 6; Sep. 1999; pp. 1777–1797.

Austrian Patent Office Search Report and Written Opinion, dated Nov. 22, 2002.

* cited by examiner

*Primary Examiner*—Albert Decady
*Assistant Examiner*—Cynthia Britt
(74) *Attorney, Agent, or Firm*—Jenkens & Gilchrist

(57) ABSTRACT

Precoders and their corresponding logic schemes, together with a method of using the precoders and their schemes to generate a media code sequence of symbols for data storage channels, with partial response equalization and a multilevel encoding/modulation scheme. Partial responses are defined by the classical and modified target polynomials, while the multilevel encoding/modulation schemes include: 1) Structured Set Partitions (SSP), 2) a set of conventional block codes with different error correcting capabilities, and 3) a variety of iterative decoding such as the List Trellis Decoder (LTD), the BCJR algorithm, and soft decoding of low-density parity check codes. The precoders are derived from the SSP's, and combined with conventional ECC encoders designed for error detection, or error correction, or both. A cascade of parallel ECC encoders, followed by an SSP precoder, increases the minimum Euclidean distance between different media code sequences of symbols, and as a result gives lower bit error rates after decoding.

22 Claims, 9 Drawing Sheets

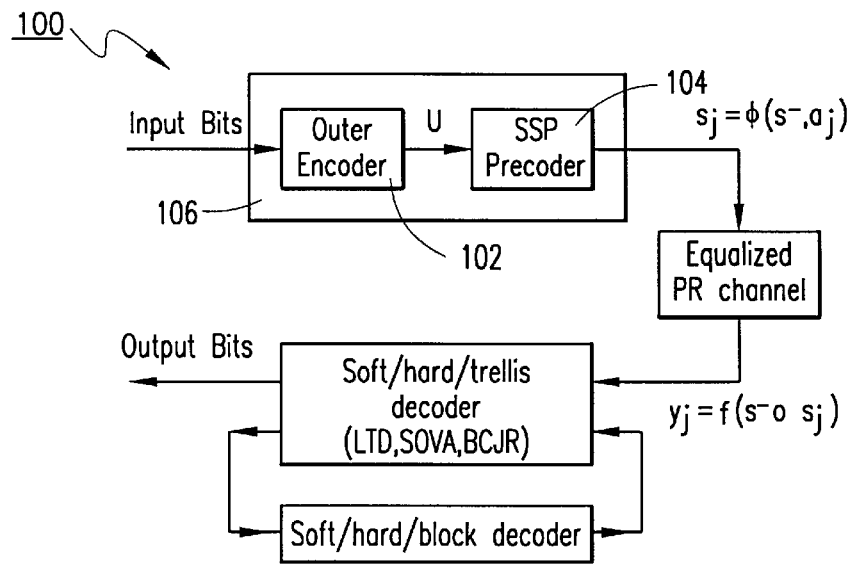
FIG. 1
| Data D1 | Parity bits of ECC1 |
| Data D2 | Parity bits of ECC2 |
| Data D3 | Parity bits of ECC3 |
FIG. 2
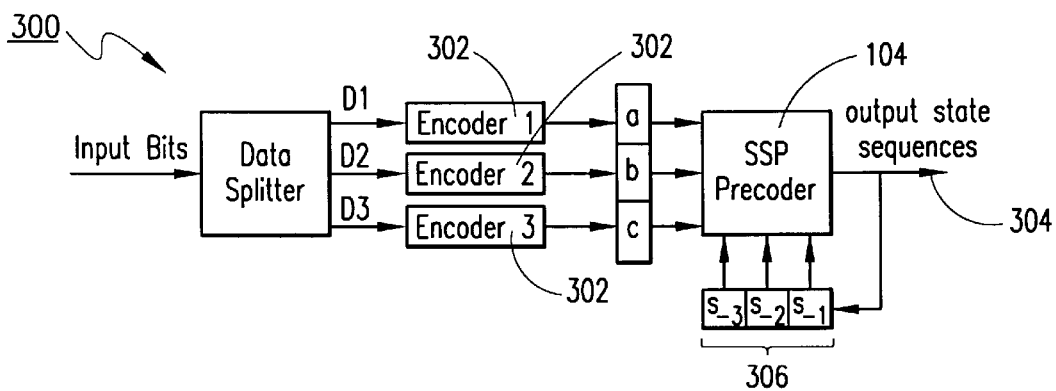
FIG. 3

$s_0 = (\bar{a} \& s_{-2}) \oplus c$
$s_1 = (a \& s_{-2}) \oplus s_{-1} \oplus b \oplus c$
$s_2 = s_{-2} \oplus a$ $s_0 = (\overline{a \oplus b} \& s_{-2}) \oplus c$
$s_1 = ((a \oplus b) \& s_{-2}) \oplus s_{-1} \oplus c \oplus b$
$s_2 = a \odot b \oplus s_{-2}$ $s_0 = (\overline{a \oplus b} \& s_{-2}) \oplus b \oplus c$
$s_1 = ((a \oplus b) \& s_{-2}) \oplus s_{-1} \oplus c$
$s_2 = s_{-2} \oplus a \oplus b$ $s_0 = (s_{-2} \& a) \oplus (s_{-1} \& \overline{a}) \oplus c$
$s_1 = (s_{-2} \& \overline{a}) \oplus (s_{-1} \& a) \oplus b \oplus c$
$s_2 = s_{-3} \oplus a$ $s_0 = (s_{-1} \,\&\, \bar{a}) \oplus c$
$s_1 = s_{-1} \oplus b$
$s_2 = s_{-1} \oplus a$ $s_0 = (s_{-2} \,\&\, \bar{a}) \oplus c$
$s_1 = (s_{-2} \,\&\, a) \oplus s_{-1} \oplus b \oplus c$
$s_2 = s_{-2} \oplus a$ $s_0 = s_{-2} \otimes b \otimes c$
$s_1 = s_{-1} \otimes b$
$s_2 = s_{-2} \otimes a \otimes c$ $s_0 = c \oplus s_{-4} \oplus (s_{-2} \& (a \oplus b))$
$s_1 = b \oplus c \oplus s_{-1} \oplus (c_{-2} \& (a \oplus b))$
$s_2 = a \oplus b \oplus s_{-2}$

PRECODERS FOR PARTIAL RESPONSE CHANNELS

BACKGROUND OF THE INVENTION

1. Field of the Invention

The present invention relates generally to methods and apparatuses used either for storing data on magnetic storage media, or for communication through channels, when equalization at the receiver side is performed according to a partial response target. More particularly, it relates to PR channels with concatenated coding for error detection and correction.

2. Description of the Related Art

As can be noted from R. Karabed, P. Siegel, E. Soijanin, "Constrained Coding for Binary Channels with High Intersymbol Interference," IEEE Transaction on Information Theory, vol. IT-45, No. 6, September 1999, pp 1777–1797, imposing certain constraints on modulation codes for partial response (PR) channels increases the minimum free Euclidean distance of the decoding trellis, which consequently improves the Bit-Error-Rate (BER) characteristics. However, this improvement is achieved at the cost of increased complexity in encoding/decoding circuits. For example, the Maximum-Transition-Run (MTR) code constraint increases the minimum squared Euclidean distance from 6 to 10 in an EPR4 channel, producing about 2.2 dB in coding gain. The gain can be further improved (by up to 3.5 dB) by using a modified target and the 16/17 quasi-MTR code. The 16/17 quasi-MTR code allows three (but not four) consecutive transitions, and thus results in 65,546 code words of length 17 that meet the code constraint. Since 65,536 different 16-bit input patterns are to be encoded out of the available 17-bit patterns for this code, the complexity of the encoder/decoder circuits is relatively large.

As a general rule, using nontrivial distance enhancing constraints leads to relatively complicated decoding trellises, and as a consequence, to "bulky" time variant decoding circuits. U.S. Pat. No. 5,497,384 discusses a read/write channel with a time variant decoding trellis. Such a decoding method employs a detector trellis structure, which consists of connected trellises with periodically repeated patterns of nodes and subtrellises, that is, it is a periodic permutation of states. The ending states of one subtrellis must mate with the beginning states of an adjacent subtrellis to generate a detector trellis structure for arbitrarily long sequences. Therefore, the survivor metric and survivor sequence for an ending of a subtrellis will be assigned to the beginning state of the subsequent subtrellis with which it is mated. The mating of the ending states and beginning states ensures that the resulting trellis will contain no distance 2 events, and it is therefore used to increase minimum distance properties and reduce error event length.

Alternative solutions are based on a coded modulation technique using so-called Structured Set Partitions (SSP) of the PR channel. See A. Kuznetsov and M. Umemoto, "Structured Set Partitions and Multilevel Concatenated Coding for Partial Response Channels", IEEE Transactions on Communications, vol. COM-47, No. 6, June 1999, pp. 856–861. The first proposed scheme of this type combines the List Trellis Detector (LTD), which can be considered as a modified Viterbi Algorithm (VA) that searches for the two best paths in the trellis, and an efficient concatenated coding scheme that uses conventional block codes with different error correction capabilities. The structure is quite flexible and can be applied to different types of PR channels, to set different code lengths and error correction capabilities, and to use well-known algebraic and probabilistic decoders for component codes. This significantly improves the overall signal-to-noise ratio (SNR) performance of the read channel compared to the uncoded PR solutions. For the EPR4 channel using the Lorentzian model with user densities of 2.5 and 3.0, the expected SNR gain is between 1.9 and 2.0 dB compared to the uncoded EPR4 channel, and between 2.7 and 2.8 dB compared to the rate 16/17 (d=0, 6/6) coded EPR4 channel.

U.S. Pat. No. 5,881,071 discusses one read/write channel of this type that may consist of the following three steps: 1) An incoming data sequence is de-multiplexed into two or more subsequences. 2) Each of these subsequences is encoded using a conventional encoder designed for error detection or correction purposes. 3) Finally, the parallel sub-strings in the output of the encoders are converted into the channel media code according to the unique SSP table that partitions output words of the EPR4 channel into special subsets. These subsets are characterized by the spectrum of squared minimal Euclidean distances $\{d_0^2=4, d_1^2=8, d_2^2=16\}$. The SSP table is a key element in the approach in U.S. Pat. No. 5,881,071, since in the EPR4 channel the minimal squared Euclidean distance $d^2$ of the 3-level concatenated code satisfies $d^2 \geq \min\{d_0^2 D_0, d_1^2 D_1, d_2^2 D_2\}$, where $D_0$, $D_1$, and $D_2$ are the minimum Hamming distances of the conventional codes used at stage 2 of the encoding process. For example, if $D_0=8$ (as in the extended binary Golay code), $D_1=4$ (as in the Hamming code), and $D_2=2$ (as in the trivial parity check), then $d^2 \geq 32$. The drawback of this SSP based approach is the lack of SSP tables for different types of PR channels, and the complexity of the precoders using Read Only Memory (ROM) to store the SSP table. U.S. Pat. No. 5,881,071 teaches the provision of only one SSP table for an EPR4 channel.

The Soft-Output Viterbi Algorithm (SOVA) is another modified VA that gives the most likely path sequence in the trellis as well as the a posteriori probability for each transmitted bit. Similar a posteriori probabilities (soft outputs) are also given by the BCJR algorithm. Since the SOVA and BCJR operate on a trellis, they can be used for a PR channel. These algorithms can also be combined with a soft decoding scheme for block or convolutional modulation codes. A problem with the above mentioned decoding schemes is that, although the BER of such schemes approaches record high levels, the complexity of the decoding schemes implementation and the time delays involved, raise serious problems and have drawbacks.

SUMMARY OF INVENTION

The problems and drawbacks of the above mentioned techniques are overcome by utilizing simple, efficient SSP precoders, along with exemplary embodiments of the present invention so that the complexity and time delay of a decoder scheme is minimized or reduced for many types of PR channels. The main task of an exemplary embodiment of this invention is to produce precoders and their corresponding logic schemes, together with a method of using these precoders and their schemes, to generate a media code sequence of symbols for data storage channels, with partial response equalization and a multilevel encoding/modulation scheme. Partial responses are defined by the classical and modified target polynomials, while multilevel encoding/modulation schemes include 1) Structured Set Partitions (SSP), 2) a set of conventional block codes with different error correcting capabilities, and 3) a variety of iterative decoding methods such as the List Trellis Decoder (LTD), the BCJR algorithm, and soft decoding of low-density parity check codes. Precoders are derived from the SSP's, and combined with ECC encoders that are designed for error detection, or error correction, or both. A cascade of parallel ECC encoders followed by an SSP precoder, increases the minimum Euclidean distance between different media code sequences of symbols, and as a result gives lower bit error rates after decoding.

BRIEF DESCRIPTION OF THE DRAWINGS

The present invention may be better understood by consulting the following Detailed Description in conjunction with the accompanying Drawings wherein:

FIG. 1 is a block diagram of a read/write channel.

FIG. 2 is a diagram showing the general structure of an outer code matrix.

FIG. 3 shows a 3-level concatenated encoder combined with an SSP-precoder.

DETAILED DESCRIPTION OF THE PREFERRED EXEMPLARY EMBODIMENTS

Figure 4:
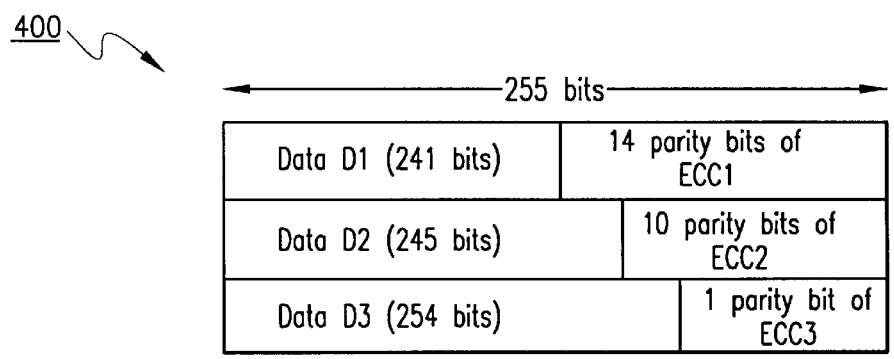
FIG. 4 shows an example of an outer code matrix using 2 block codes for burst error correction and a parity check code.

Referring now to the drawings, and in particular to FIG. 1, there is shown the structure of a read/write channel 100 with an L-level concatenated encoder 102 followed by an SSP precoder 104, and the functions of its main blocks. Encoding part of the channel 100 consists of a set of algebraic encoders 102 and a precoder 104. The combination of the encoder 102 and precoder 104 provide an encoder/precoder complex 106. Algebraic encoders generate an outer code matrix U of size L×n, L≦1, such that its i-th row is a code word of the code $C_i$ with alphabet size $q_i=2^{l(i)}$, and minimum Hamming distance, $D_i$, i=0, 1, ..., L−1. In the general case, the parameters l(i) are arbitrary positive integers, such that l(0)+l(1)+ ... +l(L−1)=l, but in our examples below l=L=3, i.e., l(0)=l(1)=l(2)=1. Coded modulation schemes are usually set up so that $D_0 > D_1 > ... > D_{L-1}$. The general structure of an outer code matrix 200 for L=3, is shown in FIG. 2.

An outer code matrix, U, is generated by a set of parallel conventional ECC encoders 302, as shown in FIG. 3 in the encoder/precoder complex 300 for the case when each row of an outer code matrix U is generated by its own encoder.

The columns $u_0, u_1, ..., u_{n-1}$ of an outer code matrix U are sequentially sent to a precoder 104. At the time instant j, for j=0, 1, ..., n−1, using $u_j$ and the current state of the channel, $s^-=(s_{l-m}, ..., s_{l-2}, s_{l-1})$, the precoder generates a state sequence extension, $s=\phi(s^-, u_j)$, of length l, and sends it to its output 304. At the same time, it also updates its internal register containing $s^-$ 306: If l=m, then $s^-$ is simply replaced by s. If l<m, then the new state $s^-$ is a concatenation of the last m−l bits of $s^-$ and s. If l>m, then the new state $s^-$ 306 consists of the last m bits of s.

An input of the PR channel is a bipolar sequence ( ..., $x_{-1}, x_0, x_1, x_2, ...$ ) with components $x_i$, $2s_i−1=\pm 1$, where $s_i$=0, 1 is a binary output of the precoder. Given a target $f=[f_0, f_1, ..., f_m]$ with integer (real or complex in general case) components, an output symbol $y_i$ of the PR channel at the time instant i is defined by the equality $$y_i = (f_m x_{i-m} + ... + f_2 x_{i-2} + f_1 x_{i-1}) + f_0 x_i \qquad (1)$$

The bipolar word $x^-=(x_{l-m}, ..., x_{l-2}, x_{l-1})$ and its binary version $s^-=(s_{l-m}, ..., s_{l-2}, s_{l-1})$ are both called states of the channel at the time instant i. The current state $s^-$ 306 and a sequence of subsequent state bits $s=(s_l, s_{l+1}, s_{l+2}, \ldots)$ define an output word 304 of the PR channel, $y=(y_l, y_{l+1}, y_{l+2}, \ldots)$, by application of (1), component-by-component. Therefore, the word y is a function $f(s^{-\circ} s)$ of the concatenation $s^{-\circ} s=(s_{i-m}, \ldots, s_{l-2}, s_{l-1}, s_l, s_{l+1}, s_{l+2}, \ldots)$ of $s^-$ and s. This function is time invariant, and the length of y is equal to the length of s. In matrix notation, we have $y=f(s^{-\circ} s)=x^*F$, where the matrix $$F = \begin{vmatrix} f_m & 0 & \cdots & 0 \\ f_{m-1} & f_m & \cdots & 0 \\ \cdots & \cdots & \cdots & \cdots \\ f_0 & f_1 & \cdots & f_m \\ 0 & f_0 & \cdots & f_{m-1} \\ \cdots & \cdots & \cdots & \cdots \\ 0 & 0 & \cdots & f_0 \end{vmatrix} \qquad (2)$$

has size $(m+l) \times l$, and x is the bipolar representation of the compound state $s^{-\circ} s$.

The method of Structured Set Partitions (SSP) has proved to be a useful tool in constructing precoder functions $\phi(s^-, u_j)$ with good spectra of minimal squared Euclidean distances $\{d_0^2, d_1^2, \ldots, d_{L-1}^2\}$.

An output L-level concatenated modulation code C of length $N=nl$ is the set of all sequences $F(s_0, U) = (f(s_0^\circ \phi(s_0, u_0))^\circ f(s_1^\circ \phi(s_1, u_1))^\circ \ldots \circ f(s_{n-1}^\circ \phi(s_{n-1}, u_{n-1})))$, where $s_0$ is the initial state of the channel, and $s_j$ is the next state after $s_{j-1}$, for $j=1, 2, \ldots, n$. The rate R of the code C is equal to $(l(0)k_0 + l(1)k_1 + \ldots + l(L-1)k_{L-1})/N$, where $k_i$ is the number of $q_i$-ary information symbols of the code $C_i$, $i=0, 1, \ldots, L-1$.

If the SSP has a spectrum of minimal squared Euclidean distances $\{d_0^2 < d_1^2 < \ldots < d_{L-1}^2\}$, then the minimal squared Euclidean distance $d^2(C)$ of the L-level concatenated code C satisfies the inequality:

$$d^2(C) \geq \min\{d_0^2 D_0, d_1^2 D_1, \ldots, d_{L-1}^2 D_{L-1}\} \qquad (3)$$

where $D_i$ is the minimum Hamming distance of $C_i$, $i=0, 1, \ldots, L-1$.

Although the lower bound in (3) is based only on the minimum distances, the detection scheme and its error statistic usually require component codes that correct or at least detect some specific types of errors. In particular, simulations of an exemplary embodiment of the present invention with List Trellis Decoding (LTD), have shown that for a given BER, higher user densities can be achieved using burst error correcting codes $C_i$ instead of block codes, to correct the same number of independent bit errors.

Figure 5:
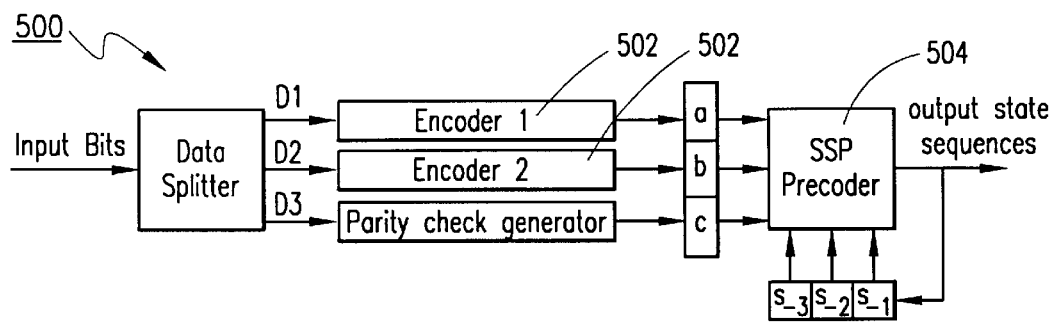
FIG. 5 shows an SSP precoder and an encoder generating the outer code matrix shown in FIG. 4.

FIG. 4 is an example of an outer code matrix 400 with 3 rows and 256 columns. Its first two rows are code words of two different cyclic codes, correcting single bursts of errors of length 5 and 3, and having 14 and 10 redundant bits, respectively. The last row consists of 254 data bits and a single parity bit in the last position. The code rate equals 740/765≈0.967. The corresponding encoder/precoder complex 500 is shown as a cascade of encoders 502 and precoder 504 in FIG. 5.

Figure 6:
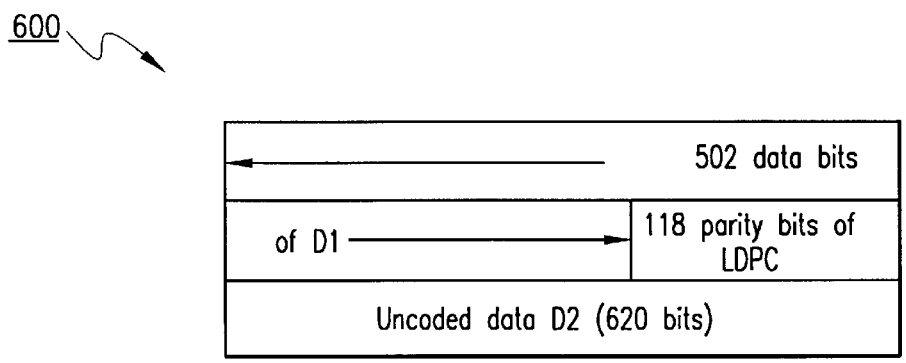
FIG. 6 shows an example of an outer code matrix using block code with a low density parity check matrix (LDPC code) in the first two rows.
Figure 7:
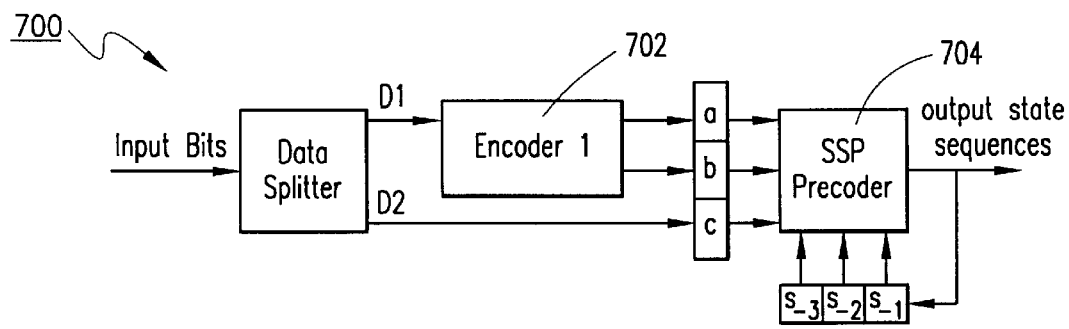
FIG. 7 shows an SSP precoder and an encoder generating the outer code matrix shown in FIG. 6.

FIG. 6 depicts an outer code matrix 600 with 3 rows of length 620, the first two of which contain a code word of the so called LDPC code, with a low density parity check matrix of size 120×1240. This code has 3 orthogonal parity check equations for each of 1240 code bits, and is suitable for "turbo" type coding algorithms. The third row of this outer code matrix consists of uncoded data bits. The code rate equals 1742/1860≈0.936. The corresponding encoder/precoder complex 700 is shown as a cascade of an encoder 702 and a precoder 704 in FIG. 7.

Figure 8:
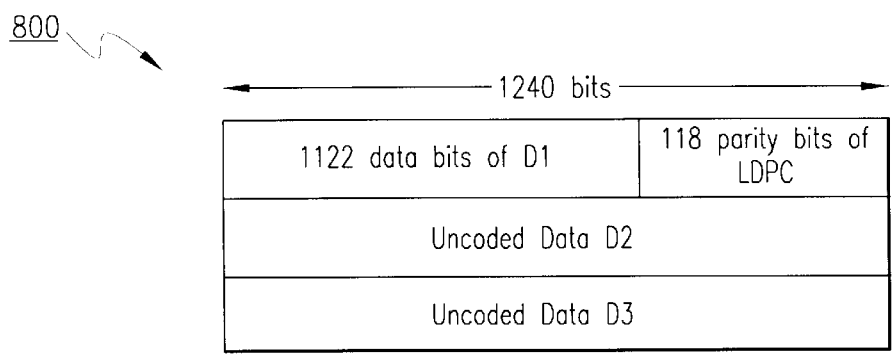
FIG. 8 shows an example of an outer code matrix using LDPC code in the first row.
Figure 9:
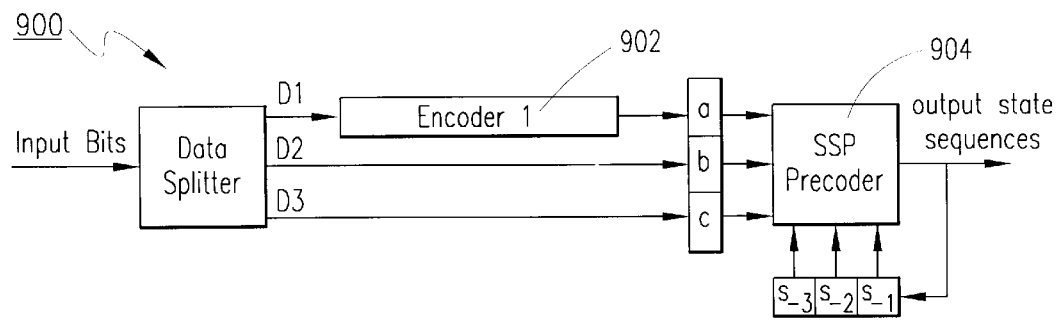
FIG. 9 shows an SSP precoder and an encoder generating the outer code matrix shown in FIG. 8.
Figure 10:
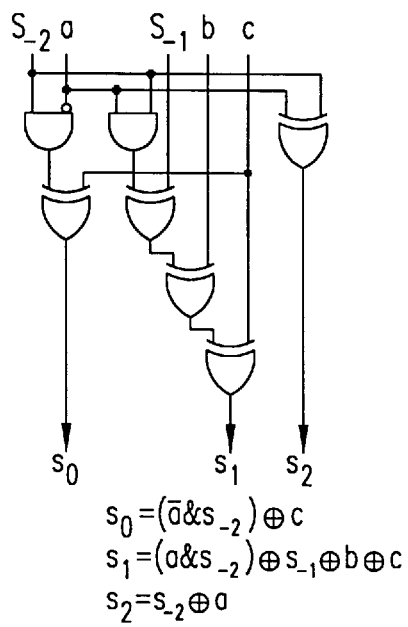
FIG. 10 is the SSP precoder which maps the given stage $s^-=(s_{-2}, s_{-1})$ and three new code bits a, b, and c to the next state $s=(s_0, s_1, s_2)$ for the EPR4 channel with the target [1, 1, −1, −1]. It gives the spectrum of minimal Euclidean distances $\{d_0^2=4, d_1^2=8, d_2^2=16\}$.
Figure 11:
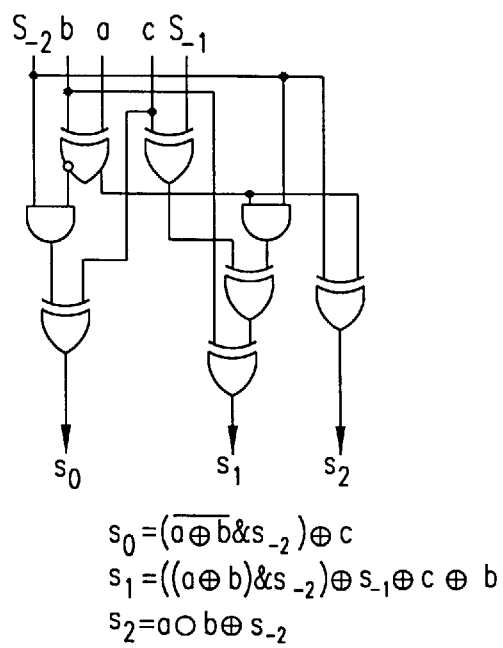
FIG. 11 is the SSP precoder which maps the given state $s^-=(s_{-2}, s_{-1})$ and three new code bits a, b, and c to the next state $s=(s_0, s_1, s_2)$ for the EPR4 channel with the target [1, 1, −1, −1]. It gives the spectrum of minimal Euclidean distances $\{d_0^2=4, d_1^2=4, d_2^2=16, d_3^2=8\}$.
Figure 12:
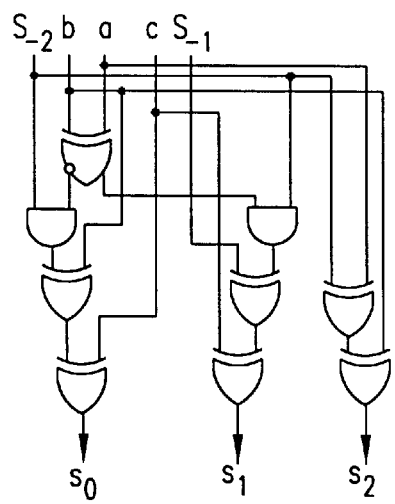
FIG. 12 is the SSP precoder which maps the given state $s^-=(s_{-2}, s_{-1})$ and three new code bits a, b, and c to the next state $s=(s_0, s_1, s_2)$ for the EPR4 channel with the target [1, 1, −1, −1]. It gives the spectrum of minimal Euclidean distances $\{d_0^2=4, d_1^2=4, d_2^2=16, d_3^2=8\}$.
Figure 13:
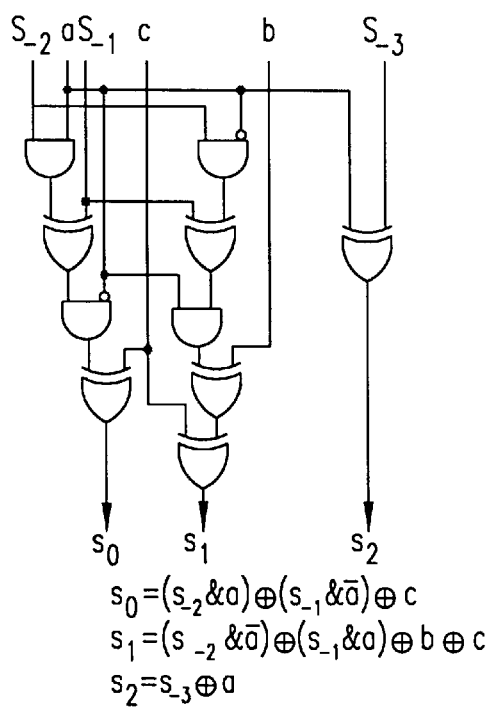
FIG. 13 is the SSP precoder which maps the given state $s^-=(s_{-3}, s_{-2}, s_{-1})$ and three new code bits a, b, and c to the next state $s=(s_0, s_1, s_2)$ for the EPR4 channel with the target [1, 2, −2, −1]. It gives the spectrum of minimal Euclidean distances $\{d_0^2=4, d_1^2=12, d_2^2=24\}$.
Figure 14:
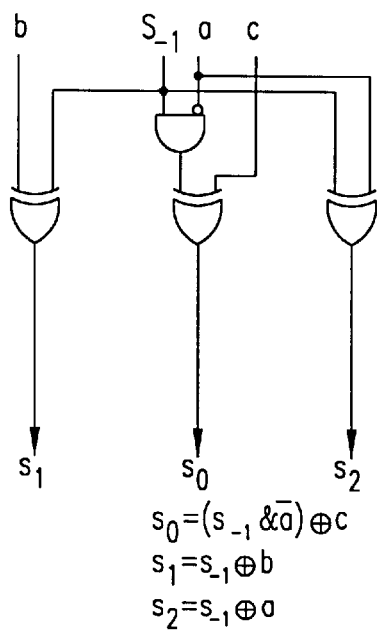
FIG. 14 is the SSP precoder which maps the given state $s^-=(s_{-1})$ and three new code bits a, b, and c to the next state $s=(s_0, s_1, s_2)$ for the MEPR4 channel with the target [1, 2, −2, −1]. It gives the spectrum of minimal Euclidean distances $\{d_0^2=4, d_1^2=16, d_2^2=16\}$.
Figure 15:
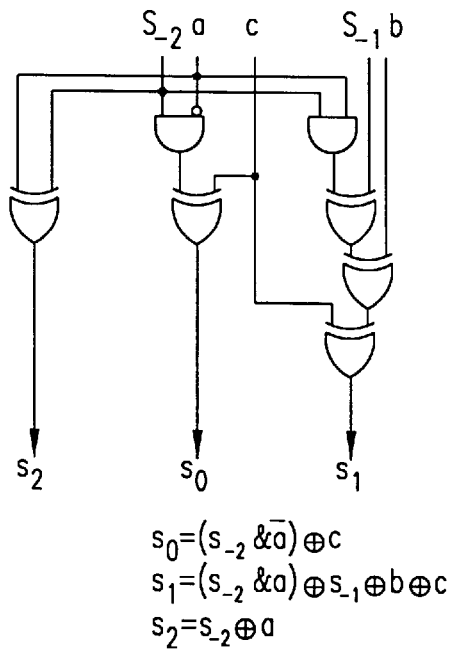
FIG. 15 is the SSP precoder which maps the given state $s^-=(s_{-2}, s_{-1})$ and three new code bits a, b, and c to the next state $s=(s_0, s_1, s_2)$ for the MEPR4 channel with the target [2, 3, −3, −2]. It gives the spectrum of minimal Euclidean distances $\{d_0^2=12, d_1^2=36, d_2^2=64\}$.
Figure 16:
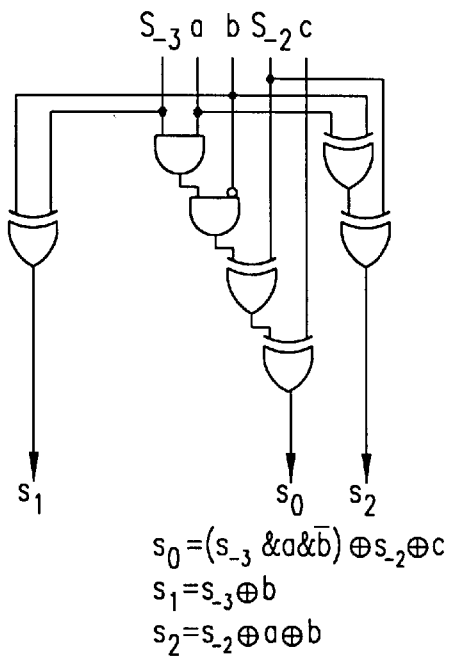
FIG. 16 is the SSP precoder which maps the given state $s^-=(s_{-3}, s_{-2})$ and three new code bits a, b, and C to the state extension $s=(s_0, s_1, s_2)$ for the $E^2PR4$ channel with the target [1, 2, 0, −2, −1]. It gives the spectrum of minimal Euclidean distances $\{d_0^2=4, d_1^2=8, d_2^2=16\}$.
Figure 17:
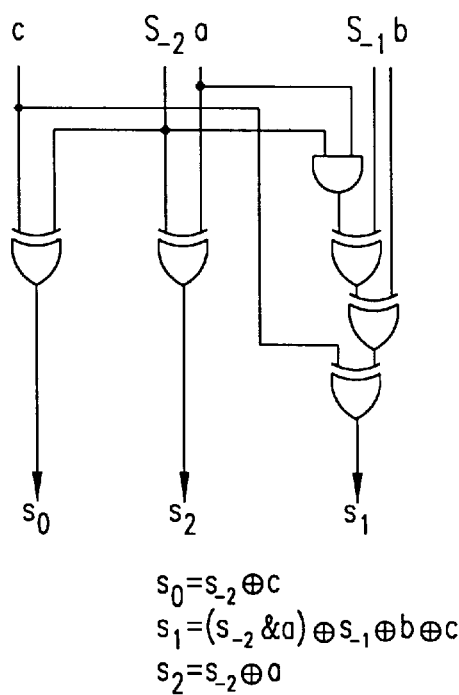
FIG. 17 is the SSP precoder which maps the given state $s^-=(s_{-2}, s_{-1})$ and three new code bits a, b, and c to the state extension $s=(s_0, s_1, s_2)$ for the $ME^2PR4$ channel with the target [1, 3, 0, −3, −1]. It gives the spectrum of minimal Euclidean distances $\{d_0^2=4, d_1^2=16, d_2^2=44\}$
Figure 18:
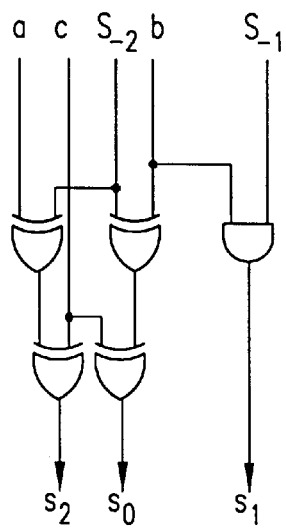
FIG. 18 is the SSP precoder which maps the given state $s^-=(s_{-2}, s_{-1})$ and three new code bits a, b, and c to the state extension $s=(s_0, s_1, s_2)$ for the $ME^2PR4$ channel with the target [1, 3, 0, −3, −1]. It gives the spectrum of minimal Euclidean distances $\{d_0^2=4, d_1^2=20, d_2^2=24\}$.
Figure 19:
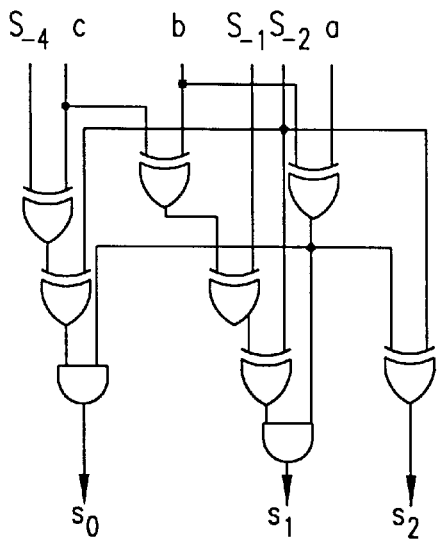
FIG. 19 is the SSP precoder which maps the given state $s^-=(s_{-4}, s_{-2}, s_{-1})$ and three new code bits a, b, and c to the state extension $s=(s_0, s_1, s_2)$ for the $ME^2PR4$ channel with the target [5, 4, −3, −4, −2]. It gives the spectrum of minimal Euclidean distances $\{d_0^2=16, d_1^2=36, d_2^2=116\}$.

FIG. 8 shows an outer code matrix 800 with 3 rows of length 1240. The first row is a code word of the above mentioned LDPC code, and the last two rows are filled by uncoded data bits. The code rate equals 3602/3720≈0.968. The corresponding encoder/precoder complex 900 is shown as a cascade of an encoder 902 and a precoder 904 in FIG. 9.

FIGS. 10 through 19 depict a number of different precoder functions, and the corresponding logic schemes for their implementation.

Although the foregoing description of concatenated encoding followed by SSP precoding is of prime importance here, other types of conventional ECC codes and parameter values, such as code lengths and minimum Hamming distances, can be applied to the system in accordance with the teachings of the invention.

The previous description is of a preferred embodiment for implementing the invention, and the scope of the invention should not necessarily be limited by this description. The scope of the present invention is instead defined by the following claims.

What is claimed is:

1. A partial response channel utilizing concatenated coding for error detection and correction, said partial response channel comprising:
   at least two encoders for error checking and correcting, each said encoder receiving a stream of data and producing an outer code matrix; and
   a precoder for receiving each said outer code matrix from each encoder and encoding a series of multi-bit-length sequences of digital electrical signals, the combination of said at least two encoders and said precoder adapted to increase a minimum Euclidean distance between said multi-bit-length sequences of digital electrical signals.

2. The partial response channel of claim 1, wherein said series of multi-bit-length sequences are composed of 5-bit-length sequences and wherein said precoder encodes said 5-bit-length sequences comprising 2 said precoder's previous output bits ($s_{-2}$ and $s_{-1}$) and 3 code data bits (a, b and c), into 3 output media bits ($s_0$, $s_1$, and $s_2$) which are generated according to $s_0 = (\bar{a}_1 \ \& \ s_{-2}) \oplus c$, $s_1 = (a \ \& \ s_{-2}) \oplus s_{-1} \oplus b \oplus c$, and $s_2 = s_{-2} \oplus a$, where $\oplus$ is the exclusive OR operator.

3. The partial response channel of claim 1, wherein said series of multi-bit-length sequences are composed of 5-bit-length sequences and wherein said precoder encodes said 5-bit-length sequences comprising 2 said precoder's previous output bits ($s_{-2}$ and $s_{-1}$) and 3 coded data bits (a, b and c) into 3 output media bits ($s_0$, $s_1$, and $s_2$) which are generated according to $s_0 = (a \oplus b \ \& \ s_{-2}) \oplus c$, $s_1 = ((a \oplus b) \ \& \ s_{-2}) \oplus s_{-1} \oplus c \oplus b$, and $s_2 = a \oplus b \oplus s_{-2}$.

4. The partial response channel of claim 1, wherein said series of multi-bit-length sequences are composed of 5-bit-length sequences and wherein said precoder encodes said 5-bit-length sequences comprising 2 said precoder's previous output bits ($s_{-2}$ and $s_{-1}$) and 3 coded data bits (a, b and c) into 3 output media bits ($s_0$, $s_1$ and $s_2$) which are generated according to $s_0 = (a \oplus b \ \& \ s_{-2}) \oplus b \oplus c$, $s_1 = ((a \oplus b) \ \& \ s_{-2}) \oplus s_{-1} \oplus c$, and $s_2 = s_{-2} \oplus a \oplus b$.

5. The partial response channel of claim 1, wherein said series of multi-bit-length sequences are composed of 6-bit-length sequences and wherein said precoder encodes said 6-bit-length sequences comprising 3 said precoder's previous output bits ($s_{-3}$, $s_{-2}$ and $s_{-1}$) and 3 coded data bits (a, b and c) into 3 output media bits ($s_0$, $s_1$ and $s_2$) which are generated according to $s_0 = (s_{-2} \ \& \ a) \oplus (s_{-1} \ \& \ \bar{a}) \oplus c$, $s_1 = (s_{-2} \ \& \ \bar{a}) \oplus (s_{-1} \ \& \ a) \oplus b \oplus c$, and $s_2 = s_{-3} \oplus a$.

6. The partial response channel of claim 1, wherein said series of multi-bit-length sequences are composed of 4-bit-length sequences and wherein said precoder encodes said 4-bit-length sequences comprising 1 said precoder's previous output bit $s_{-1}$ and 3 coded data bits (a, b and c), into 3 output media bits ($s_0$, $s_1$ and $s_2$) which are generated according to $s_0=(s_{-1}\ \&\ \bar{a})\oplus c$, $s_1=s_{-1}\oplus b$, and $s_2=s_{-1}\oplus a$.

7. The partial response channel of claim 1, wherein said series of multi-bit-length sequences are composed of 5-bit-length sequences and wherein said precoder encodes said 5-bit-length sequences comprising 2 said precoder's previous output bits ($s_{-2}$ and $s_{-1}$) and 3 coded bits (a, b and c), into 3 output media bits ($s_0$, $s_1$ and $s_2$) which are generated according to $s_0=(s_{-2}\ \&\ \bar{a})\oplus c$, $s_1=(s_{-2}\ \&\ a)\oplus s_{-1}\oplus b\oplus c$, and $s_2=s_{-2}\oplus a$.

8. The partial response channel of claim 1, wherein said series of multi-bit-length sequences are composed of 5-bit-length sequences and wherein said precoder encodes said 5-bit-length sequences comprising 2 said precoder's previous output bits ($s_{-3}$ and $s_{-2}$) and 3 coded bits (a, b and c) into 3 output media bits ($s_0$, $s_1$ and $s_2$) which are generated according to $s_0=(s_{-3}\ \&\ a\ \&\ )\oplus s_{-2}\oplus c$, $s_1=s_{-3}\oplus b$, and $s_2=s_{-2}\oplus a\oplus b$.

9. The partial response channel of claim 1, wherein said series of multi-bit-length sequences are composed of 5-bit-length sequences and wherein said precoder encodes said 5-bit-length sequences comprising 2 said precoder's previous output bits ($s_{-2}$ and $s_{-1}$) and 3 coded data bits (a, b and c) into 3 output media bits ($s_0$, $s_1$ and $s_2$) which are generated according to $s_0=s_{-2}\oplus c$, $s_1=(s_{-2}\ \&\ a)\oplus s_{-1}\oplus b\oplus c$, and $s_2=s_{-2}\oplus a$.

10. The partial response channel of claim 1, wherein said series of multi-bit-length sequences are composed of 5-bit-length sequences and wherein said precoder encodes said 5-bit-length sequences comprising 2 said precoder's previous output bits ($s_{-2}$ and $s_{-1}$) and 3 coded data bits (a, b and c) into 3 output media bits ($s_0$, $s_1$ and $s_2$) which are generated according to $s_0=s_{-2}\oplus b\oplus c$, $s_1=s_{-1}\oplus b$, and $s_2=s_{-2}\oplus a\oplus c$.

11. The partial response channel of claim 1, wherein said series of multi-bit-length sequences are composed of 6-bit-length sequences and wherein said precoder encodes said 6-bit-length sequences comprising 3 said precoder's previous output bits ($s_{-4}$, $s_{-2}$, and $s_{-1}$) and 3 coded data bits (a, b and c) into 3 output media bits ($s_0$, $s_1$ and $s_2$) which are generated according to $s_0=c\oplus s_{-4}\oplus(s_{-2}\ \&\ (a\oplus b))$, $s_1=b\oplus c\oplus s_{-1}\oplus(s_{-2}\ \&\ (a\oplus b))$, and $s_2=a\oplus b\oplus s_{-2}$.

12. A method to generate a media code sequence of symbols for data storage channels, comprising the steps:

(a) de-multiplexing an input data stream into at least two, but not more than three parallel substreams;

(b) separately encoding at least one of said at least two, but not more than three parallel substreams into an encoded parallel substream by a separate block or a convolutional encoder having at least one of an error detection and/or a correction capability; and (c) converting said encoded parallel substream(s) and any remaining parallel substream(s) into said media code sequence of symbols via a precoder, said precoder operating according to three predetermined equations.

13. The method according to claim 12, wherein said predetermined equations are $s_0=(\bar{a}\ \&\ s_{-2})\oplus c$, $s_1=(a\ \&\ s_{-2})\oplus s_{-1}\oplus b\oplus c$, and $s_2=s_{-2}\oplus a$.

14. The method according to claim 12, wherein said predetermined equations are $s_0=(a\oplus b\ \&\ s_{-2})\oplus c$, $s_1=((a\oplus b)\ \&\ s_{-2})\oplus s_{-1}\oplus c\oplus b$, and $s_2=a\oplus b\oplus s_{-2}$.

15. The method according to claim 12, wherein said predetermined equations are $s_0=(a\oplus b\ \&\ s_{-2})\oplus b\oplus c$, $s_1=((a\oplus b)\ \&\ s_{-2})\oplus s_{-1}\oplus c$, and $s_2=s_{-2}\oplus a\oplus b$.

16. The method according to claim 12, wherein said predetermined equations are $s_0=(s_{-2}\ \&\ a)\oplus(s_{-1}\ \&\ \bar{a})\oplus c$, $s_1=(s_{-2}\ \&\ \bar{a})\oplus(s_{-1}\ \&\ a)\oplus b\oplus c$, and $s_2=s_{-3}\oplus a$.

17. The method according to claim 12, wherein said predetermined equations are $s_0=(s_{-1}\ \&\ \bar{a})\oplus c$, $s_1=s_{-1}\oplus b$, and $s_2=s_{-1}\oplus a$.

18. The method according to claim 12, wherein said predetermined equations are $s_0=(s_{-2}\ \&\ \bar{a})\oplus c$, $s_1=(s_{-2}\ \&\ a)\oplus s_{-1}\oplus b\oplus c$, and $s_2=s_{-2}\oplus a$.

19. The method according to claim 12, wherein said predetermined equations are $s_0=(s_{-3}\ \&\ a\ \&\ )\oplus s_{-2}\oplus c$, $s_1=s_{-3}\oplus b$, and $s_2=s_{-2}\oplus a\oplus b$.

20. The method according to claim 12, wherein said predetermined equations are $s_0=s_{-2}\oplus c$, $s_1=(s_{-2}\ \&\ a)\oplus s_{-1}\oplus b\oplus c$, and $s_2=s_{-2}\oplus a$.

21. The method according to claim 12, wherein said predetermined equations are $s_0=s_{-2}\oplus b\oplus c$, $s_1=s_{-1}\oplus b$, and $s_2=s_{-2}\oplus a\oplus c$.

22. The method according to claim 12, wherein said predetermined equations are $s_0=c\oplus s_{-4}\oplus(s_{-2}\ \&\ (a\oplus b))$, $s_1=b\oplus c\oplus s_{-1}\oplus(s_{-2}\ \&\ (a\oplus b))$, and $s_2=a\oplus b\oplus s_{-2}$.

* * * * *